United States Patent [19]

Ovens et al.

[11] Patent Number: 4,758,739

[45] Date of Patent: Jul. 19, 1988

[54] READ BACK LATCH

[75] Inventors: Kevin M. Ovens, Garland; W. T. Greer, Jr., Plano, both of Tex.

[73] Assignee: Texas Instruments Incorporated, Dallas, Tex.

[21] Appl. No.: 911,279

[22] Filed: Sep. 24, 1986

[51] Int. Cl.[4] .................... H03K 19/003; H03K 3/287
[52] U.S. Cl. ..................................... 307/289; 307/443; 307/291
[58] Field of Search ......................... 307/289, 291, 443

[56]   References Cited
U.S. PATENT DOCUMENTS 3,986,057  10/1976  Eichelberger et al. ............. 307/289

FOREIGN PATENT DOCUMENTS 4517974  6/1970  Japan ..................................... 307/289

Primary Examiner—John Zazworsky
Attorney, Agent, or Firm—Thomas R. FitzGerald; Leo N. Heiting; Melvin Sharp

[57] ABSTRACT

A read-back latch circuit which includes a latch circuit having an input and an output and an enable input and operative to transmit an input data signal to the output in response to a preselected enable signal and to block the transmission of the input data signal otherwise. A read-back switch is coupled between the output and input of said latch circuit and is operative to couple the signal on the output of said latch circuit to the input thereof in response to a read-back control signal.

8 Claims, 3 Drawing Sheets

READ BACK LATCH

BACKGROUND OF THE INVENTION

The present invention relates to an electronic circuit latch capable to latching data at its output by assuming more than one stable state.

The simplest form of latch is a flip flop logic circuit which is a binary cell capable of storing one bit of information. Such circuits are constructed from NAND gates and NOR gates and can be a simple flip flop having a set and reset input. The input signals to the latch can be controlled by applying them through AND circuits each having a clock input so that the flip flop can change state only when a clock pulse occurs. Alternatively, data can be fed through a two input AND gate coupled to one input of an OR circuit. The passage of the data through the OR gate is controlled by a latch circuit which has the output of the OR gate as one input and a clock signal as another. Such circuits can either be level sensitive, that is, able to pass data any time during an enabling clock period and then latch the data transmitted or edge triggered in which the state of the input is passed to the output at the leading edge of the enable clock pulse and then latched. For applications in which the exact time of arrival of the data may be uncertain but is within a given time interval, a level sensitive latch is appropriate. Where it is desired to transmit the data at a given instant of time coincident with other events, an edge triggered latch is appropriate. As VLSI technology moves towards smaller and smaller layouts and corresponding faster speeds clearly it is desirable to develop latches which minimize transmittal delays.

A second limitation of conventional latches arises due to there being no provision for the circuit designer to monitor the latched signal prior to its transmission to another circuit. Consequently, it is often difficult to know about the integrity of a latched signal before it is transmitted on for further processing.

SUMMARY OF THE INVENTION

According to the invention there is provided a read back latch circuit which includes a latch circuit having an input, an output and an enable input and operative to transmit an input data signal to the output in response to a preselected enable signal and to block the transmission of the input data signal otherwise. A read back switch is coupled between the output and input of the latch circuit and is operative to couple the signal on the output of the latch circuit to the input thereof in response to a read lack control signal.

BRIEF DESCRIPTION OF THE DRAWINGS

The novel features believed characteristic of the invention are set forth in the appended claims. The invention itself, however, as well as other features and advantages thereof, will be best understood by reference to the detailed description which follows, read in conjunction with the accompanying drawings, wherein:

DETAILED DESCRIPTION WITH REFERENCE TO THE DRAWINGS

Figure 1:
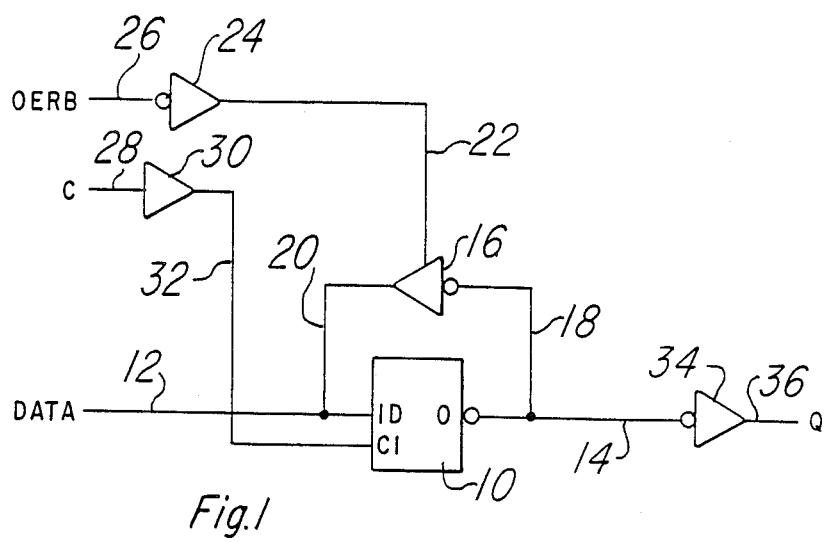
FIG. 1 is a block circuit diagram of a level sensitive read back latch.

Referring to FIG. 1, there is shown a block circuit diagram of a level sensitive latch which includes a conventional latch circuit 10 having a data input 1D, an output 0 and an enabling clock input C1. The data input 1D is connected to a data line 12 and the output 0 is connected by line 14 to an input of an inverter 34. The output of the inverter 34 on line 36 is the data output Q. The output of latch 10 on line 14 is coupled by line 18 to a gated inverter 16 gated on by a logic 1 level signal on line 22. The output of inverter 16 is coupled by line 20 to the data line 12. Another inverter 24 generates the logic one signal on line 22 in response to a low level $\overline{OERB}$ signal on line 26. A clock signal on line 28 is directed into a gate 30 and then along line 32 to the enable clock input C1.

Figure 2:
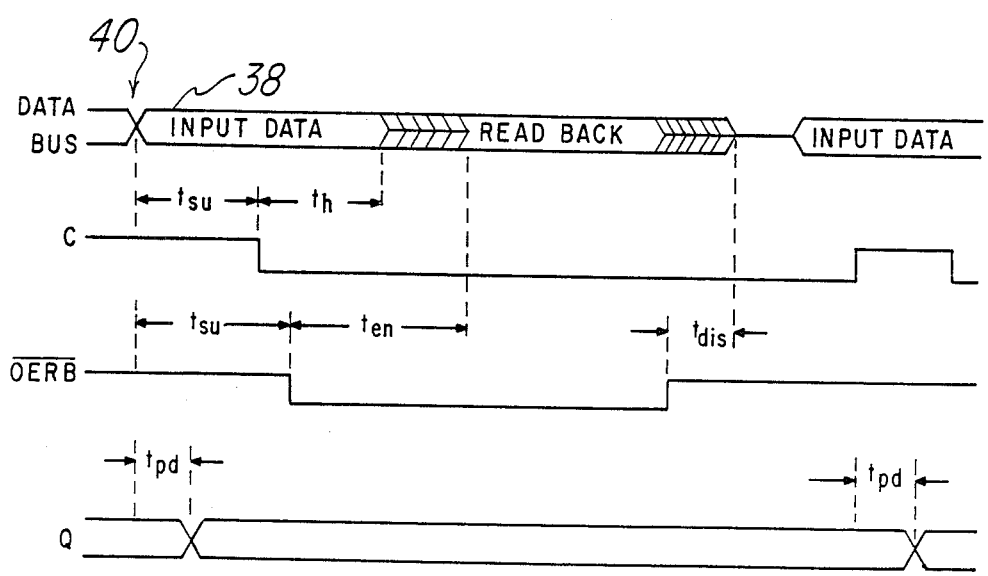
FIG. 2 is a timing diagram for the circuit of FIG. 1.

Referring to FIG. 2 which presents the waveforms for the circuit of FIG. 1, input data arrives on bus 12 at a time 40. With clock C high this data passes through latch 10 and inverter 34 to appear on Q output line 36 after a delay period $t_{pd}$. Following a setup time $t_{su}$, clock C falls low disabling latch 10. Input data is maintained for a further hold time $t_h$ to ensure there is no change in the output of the latch. A read back control input $\overline{OERB}$ goes low after a setup time $t_{su}^*$ allowing the data on the output line 14 of latch 10 to pass back onto input data bus line 12. After a delay $t_{en}$ from the fall of $\overline{OERB}$, inverter 16 turns on and read back begins. Once $\overline{OERB}$ goes high again after a time $t_{dis}$ measured from the rise of $\overline{OERB}$ the read back signal becomes inactive. Thus, by simply monitoring the input line 12 one can measure the signal at the output of the latch on the input bus line 12. Such a monitoring capability allows a latch signal to be monitored to verify its integrity before it is transmitted on for further processing.

Figure 3:
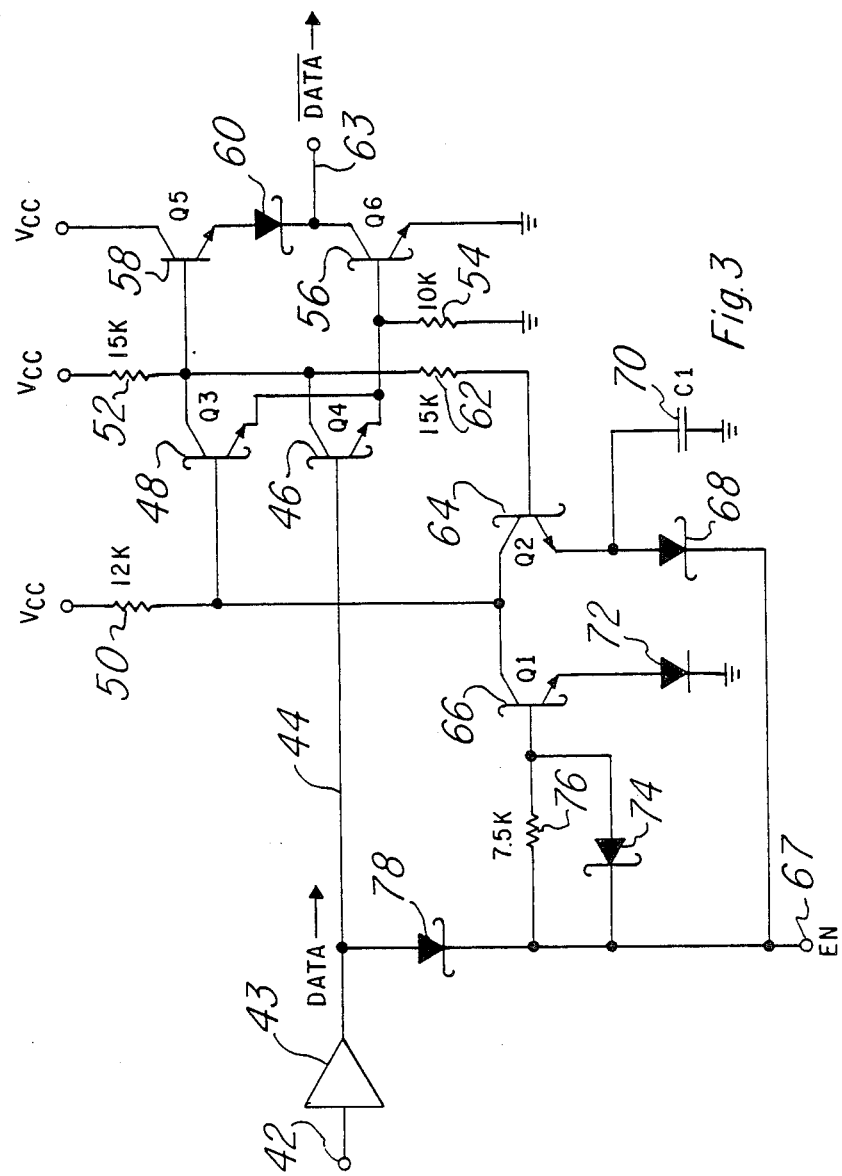
FIG. 3 is a detailed circuit diagram of the latch unit of FIG. 1.

A detailed design of the latch circuit 10 is shown in FIG. 3 in which data on line 12 is coupled by an input buffer 43 to an input buffered data line 44. Input data line 44, in turn, connects to a base of a Schottky transistor 46 which is a first state of a circuit consisting of transistors 46, 56 and 58. The emitter of transistor 46 drives the base of pull-down output transistor 56 in parallel with resistor 54 coupled from the base of transistor 56 to ground. A Schottky dode 60 in series with the emitter-collector path of pull-up transistor 58 is coupled to the collector of transistor 56. The circuit output 63 is taken from the collector of transistor 56.

A latching circuit is made up of first and second latch transistors 48 and 64, respectively, with the collector of transistor 48 driving the base of transistor 64 through resistor 62 and the collector of transistor 64 driving the base of transistor 48.

Transistor 48 has its collector and emitter coupled to the collector and emitter of transistor 46. To the collector of transistors 46 and 48 there are also coupled the base of transistor 58 and one end of a resistor 52 the other end of which connects to a high voltage supply Vcc. Coupled to line 44 is the anode of Schottky disable diode 78 the cathode of which connects to enable line 67. Resistor 76 and Schottky diode 74 are both connected in parallel between line 67 and the base of enable transistor 66. The emitter of transistor 66 connects to ground through a diode 72 while its collector couples to the collector of transistor 64, to the base of transistor 48 and one end of resistor 50, the other end of which connects to a high voltage, supply Vcc. The emitter of transistor 64 is coupled to ground through capacitor 70 and to enable line 67 through Schottky diode 68 while the base of transistor 64 is coupled to one end of a resistor 62 the other end of which connects to the collectors of transistors 46 and 48.

Operationally, with the enable signal on line 67 low, diode 78 clamps input buffered data line 44 to near ground potential as determined by the potential of the enable signal. Thus, transistor 46 is off. Transistor 56 will therefore be off.

A positive going enable clock signal passes through diode 74 which functions as a capacitor thereby turning on transistor 66 very rapidly. The base of transistor 48 drops turning it off if it is not already off. With a zero data value present turning transistor 46 remains off while transistor 58 is allowed to turn on and transistor 56 is kept off. Transistor 64 is off when line 67 is high. Thus, the output on line 63 rises to a high logic level.

If there is a high data value data present on line 44, on the rising edge of the enable signal transistor 46 passes the complement of this data value to output line 63. Because of the capacitive charge coupling effect of diode 74, transistor 66 turns on and transistor 48 off before transistor 46 passes data. Thus, with the enable signal high the circuit is transparent passing the complement of the input on line 44 to the output on line 63.

With the input data value low, on the falling edge of the enable input on line 67 into the latched mode, transistor 64 turns on through diode 68 and transistor 66 turns off through diode 74 enabling the latch. Since transistors 64 is enabled when the enable input on line 67 goes low, the time to turn on transistor 64 is very short. A low data signal on line 44 keeps transistor 48 and transistor 56 off, thereby latching the output at a high level resulting in a high signal level on line 63. When the data signal on line 44 is high, transistor 48 turns on since the voltage on its base rises faster than that on its collector, thereby resulting in a low level signal on line 63. The rate at which the collector voltage of transistor 48 rises is limited by the values of resistors 52 and 62 and the capacitance of capacitor 70 which is slower than the rate at which the base voltage of transistor 48 rises. Thus, base drive is provided to transistor 48 before it is provided to transistor 64. With transistor 48 turned on transistor 56 is also kept on while transistor 64 is kept off.

The transparent or level sensitive latch shown in FIG. 3 has the advantage of very fast enable and disable times. Most transparent latches are generally in the latched mode in a system. When the time comes to latch new data, a short pulse is applied to the enable pin forcing the latch into the transparent mode just long enough to capture the new data. The amount of time it takes for the latch to recognize the new data and store it determines the pulse width of the enable input. The longer the pulse width the slower will be the system to capture the data. Enable pulse widths of less than 2 nanoseconds have been measured using 4 nanoseconds per gate technology with this latch.

Ordinarily, a number of such circuits would be placed on a semiconductor chip the number of which depends on the number of bits in the system to which it is to be employed. For example, an 8 bit system would have 8 such circuits with common clock and read back control signals.

Figure 4:
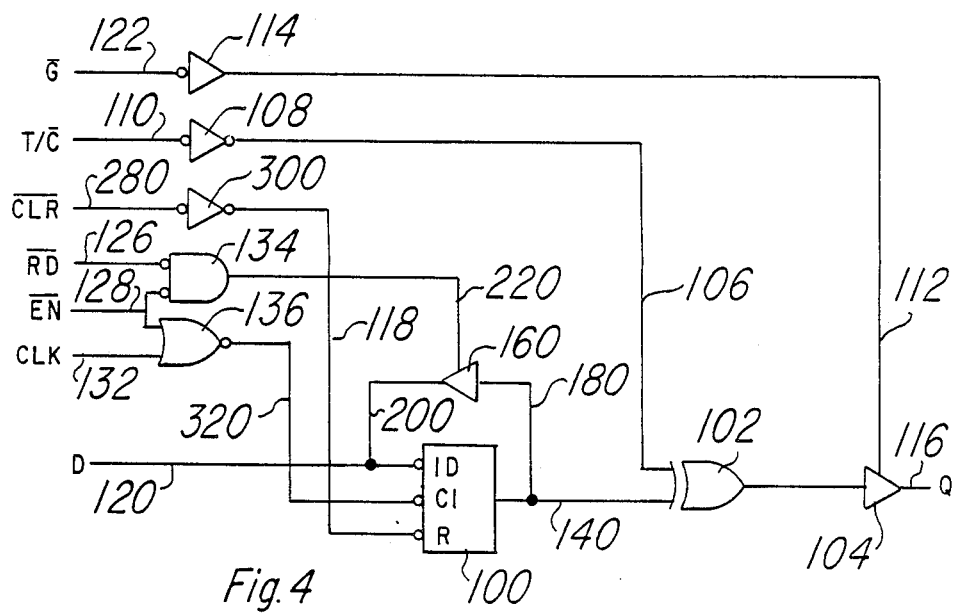
FIG. 4 is a block diagram of an edge triggered read back latch.

In certain applications where there is a possibility for the data level to change or where precise timing of the data transfer is required, it is desirable to have the latch respond to edge-triggering. FIG. 4 shows in block diagram form an edge-triggered latch which includes a conventional latch circuit 100 having a data input 1D, an enable clock input C1 and a reset input R. Data arrives on input data bus 120 to input 1D and is output on line 140 to one input of an exclusive-or circuit 102. The output of the exclusive-or circuit 102 goes through gate 104 to output Q on line 116. The read back circuit consists of gate 160 having a control gate input on line 220, aninput line 180 coupled to line 140 and an output line 200 coupled to data bus line 120. Various control signals are applied to this gate through corresponding gates. An enable clock signal CLK on line 132 is fed into one input of a NOR circuit 136 another one of which goes to an enable signal $\overline{EN}$ on line 128. The gate 160 is gated from an output of a negative logic NAND gate 134 which produces a high output in response to both of its inputs being low. The inputs to a negative logic NAND gate 134 are $\overline{EN}$ and read back signal $\overline{RD}$. A clear signal $\overline{CLR}$ passes through an inverter 300, along line 118 and into reset input R of latch 100. A low level signal $\overline{CLR}$ resets the register 100 and overrides all other register functions e.g. data and clock signals.

Output gate 104 is gated by a signal $\overline{G}$ on line 122 after the latter passes through gate 114 onto line 112. An active low $\overline{G}$ turns on gate 104. The polarity of the output can be controlled by T/$\overline{C}$ input on line 110. With T/$\overline{C}$ low the output Q on line 116 will be inverted since the exclusive-or circuit 102 for a "1" on line 106 requires a logic "0" on line 140 to product a "1" output on line 116 while a "0" on line 106 requires a "1" on line 140 to produce a "1" on the output of circuit 102.

Figure 5:
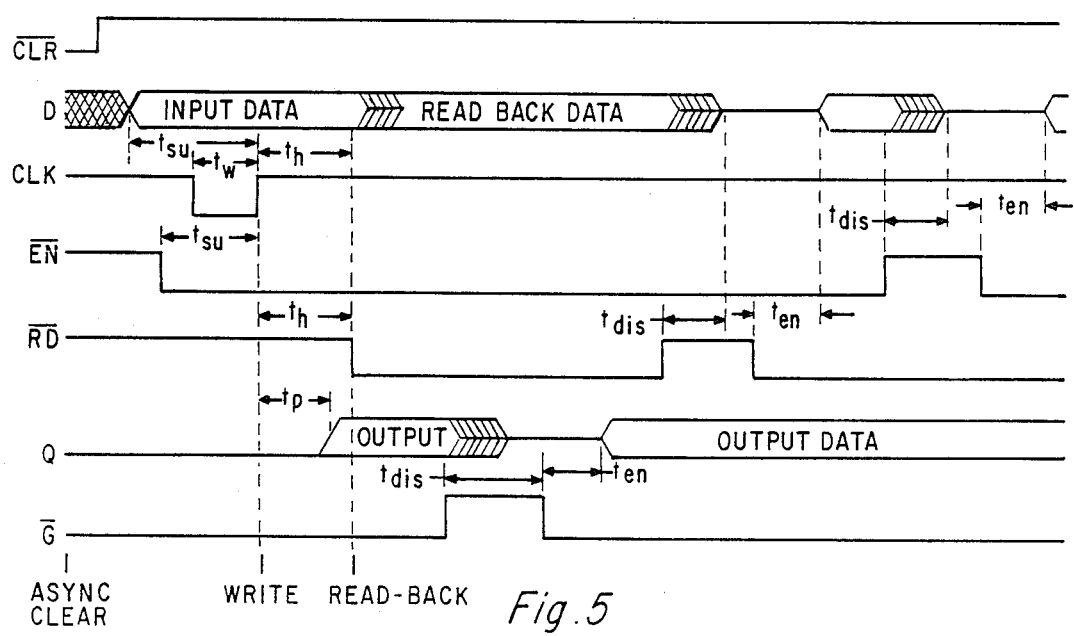
FIG. 5 is a timing diagram for the circuit of FIG. 4.

Referring to FIG. 5, the timing diagram for the circuit of FIG. 4, after a low clear $\overline{CLR}$ signal, input data arrives on data bus 120 into data input 1D. The enable signal then drops low enabling the NOR circuit 136 and the read-back NAND circuit 134. Following the drop in the enable signal $\overline{EN}$, the clock signal CLK drops low for a duration $t_w$. Upon the enable signal $\overline{EN}$ rising the latch 100 is triggered allowing data on input bus line 120 to be written in. At a time $t_p$ output data begins to appear on line 116. A hold time $t_h$ ensures that the input data has been present long enough to complete the write into the latch and that input data is no longer arriving on bus line 120. Shortly after the hold time $t_h$ the read-back control signal goes low and subsequently couples the signal on line 140 back to the input line 120. When $\overline{G}$ goes high the output line 116 is cut-off from the latch output.

While this invention has been described with reference to an illustrative embodiment, this description is not intended to be construed in a limiting sense. Various modifications of the illustrative embodiment, as well as other embodiments of the invention, will be apparent to persons skilled in the art upon reference to this description. It is, therefore, contemplated that the appended claims will cover any such modifications or embodiments as fall within the true scope of the invention.

What is claimed is:

1. A read-back latch, comprising:
   a circuit for transmitting a data input signal from a data input to a data output;
   a latching circuit coupled to said transmitting circuit and having an enable input line operative in response to preselected enable control signal of one logic level to disable said transmitting circuit and latch the signal level on the data output and in response to an enable control signal of another logic level to transmit input data to said data output during a time interval;

and a switch coupled between data output and the data input and operative in response to a read-back control signal operable after said transmission time interval to couple the output data back to the data input so that the data input signal and the read-back data output signal are not simultaneously on said data input and said read-back output signal can be monitored to verify its integrity before it is transmitted from said output to a subsequent circuit.

2. A read-back latch according to claim 1, wherein said switch is a gated logic circuit.

3. A read-back latch according to claim 1, wherein said transmitting circuit includes a buffer circuit coupled to an input of said latching circuit.

4. A read-back latch according to claim 1, wherein said transmitting circuit includes a first transmitting transistor whose emitter connects to a base of a grounded emitter transistor and whose collector connects to a base of a pull-up transistor with the emitter of the pull-up transistor coupled through a diode to the collector of the grounded emitter transistor and an output line.

5. A read-back latch according to claim 4, including a first latch transistor connected in parallel to said common emitter transistor and a second latch transistor having a base coupled to a collector of said first latch transistor, a collector coupled to a base of said first latch transistor and an emitter connected to an enable input through a diode.

6. A read-back latch according to claim 5, including an enable transistor coupled to a base of said first latch transistor said first latch transistor being operative to turn off when said enable transistor turns on, and charge transfer means coupled between the enable input line and said enable transistor for transmitting high frequency components of an enable signal to the base of said enable transistor, and a disable diode connected between a base of said fist transmitting transistor and said enable line to disable said first transmitting transistor when said enable signal is low.

7. A read-back latch according to claim 6, including a capacitor coupled from an emitter of said second latch transistor to ground and a resistor connected between a base of said second latch transistor and a collector of said first latch transistor such that the resistor capacitor time constant keeps said second latch transistor from turning on before said first latch transistor turns on when the data input signal to the base of said common emitter transmitter is high and said enable signal goes from high to low.

8. A read-back latch according to claim 6, wherein said charge transfer means is a diode connected from said enable line to a base of said enable transistor.

* * * * *